United States Patent
Wu et al.

(10) Patent No.: US 10,710,358 B2
(45) Date of Patent: Jul. 14, 2020

(54) PHOTOMASK PELLICLE GLUE RESIDUE REMOVAL

(71) Applicant: Applied Materials, Inc., Santa Clara, CA (US)

(72) Inventors: Banqiu Wu, San Jose, CA (US); Eli Dagan, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/443,341

(22) Filed: Jun. 17, 2019

(65) Prior Publication Data

US 2020/0009854 A1 Jan. 9, 2020

Related U.S. Application Data

(60) Provisional application No. 62/694,310, filed on Jul. 5, 2018.

(51) Int. Cl.
*H01L 21/027* (2006.01)
*G03F 7/20* (2006.01)
*B41C 1/10* (2006.01)

(52) U.S. Cl.
CPC ........ *B41C 1/1033* (2013.01); *G03F 7/70983* (2013.01); *H01L 21/0275* (2013.01)

(58) Field of Classification Search
CPC ............. G03F 7/70908; G03F 7/70341; G03F 7/7983; B41C 1/1033
USPC .......................................... 356/237.2; 355/30
See application file for complete search history.

(56) References Cited

U.S. PATENT DOCUMENTS

| 9,703,186 B2* | 7/2017 | Kim .......................... G03F 1/62 |
| 2004/0090605 A1* | 5/2004 | Yogev ....................... G03F 1/82 355/30 |
| 2013/0235357 A1* | 9/2013 | Delgado ............ G03F 7/70908 355/30 |
| 2016/0139501 A1 | 5/2016 | Kim et al. |
| 2018/0031962 A1 | 2/2018 | Chou et al. |

FOREIGN PATENT DOCUMENTS

| CN | 102375022 A | 3/2012 |
| CN | 206975397 U | 2/2018 |
| JP | 08066790 | 3/1996 |
| KR | 1020120097893 | 9/2012 |

OTHER PUBLICATIONS

International Search Report and Written Opinion dated Oct. 4, 2019 for Application No. PCT/US2019/036717.
Office Action for Taiwan Application No. 108122093 dated May 6, 2020.
Search Report for Taiwan Application No. 108122093 dated May 5, 2020.

* cited by examiner

*Primary Examiner* — Hung Nguyen
(74) *Attorney, Agent, or Firm* — Patterson + Sheridan, LLP

(57) ABSTRACT

Embodiments described herein generally relate to an apparatus and methods for removing a glue residue from a photomask. The glue residue may be exposed when a pellicle is removed from the photomask. Before a new pellicle can be adhered to the photomask, the glue residue may be removed. To remove the glue residue, a laser beam may be projected through a lens and focused on a surface of the glue residue. The glue residue may be ablated from the photomask by the laser beam.

20 Claims, 2 Drawing Sheets

PHOTOMASK PELLICLE GLUE RESIDUE REMOVAL

CROSS-REFERENCE TO RELATED APPLICATION

This application claims benefit of U.S. provisional patent application Ser. No. 62/694,310, filed Jul. 5, 2018, the entirety of which is herein incorporated by reference.

BACKGROUND

Field

Embodiments disclosed herein generally relate to the field of semiconductor manufacturing equipment, and more specifically, apparatus and methods for removing a glue residue from a photomask.

Description of the Related Art

During photolithography, a photomask is used to transfer a pattern to a photoresist disposed on a substrate. Particles that enter a focal plane of the photomask may damage the mask. The particles may also be imaged and transferred as part of the pattern which results in a defocused or suboptimal exposure of the photomask. A pellicle is often disposed on the photomask to prevent particles from damaging and contaminating the photomask.

The pellicle is a thin transparent film that does not affect the pattern generated by light passing through the photomask. Generally, the pellicle is glued to the photomask. Over time, deposited particles may build up on the pellicle. To remove the deposited particles, the pellicle is replaced. When a pellicle is removed from a photomask, a glue residue remains on the photomask. Before a new pellicle can be adhered to the photomask, the glue residue is removed.

Conventional techniques to remove the glue residue typically involve exposing the glue residue to a solvent to remove the glue residue from the photomask. However, the solvent can damage and contaminate the photomask. Thermal energy may also be utilized to remove the glue residue. However, the conventional thermal energy exposure undesirably increases a temperature of the photomask, often resulting in damage to the photomask. If thermal energy is not used to remove the glue, removal of the glue residue is inefficient and time consuming. Thus, conventional techniques increase photolithography tool downtime in order to remove the pellicle glue residue and clean the photomask.

Thus, an improved technique to remove glue residue from a photomask is needed.

SUMMARY

In one embodiment, an adhesive removal method is provided. The method includes removing a pellicle from a photomask to expose a glue residue. The photomask is positioned so that the glue residue is in a path of a laser beam. The laser beam is focused on a surface of the glue residue. The glue residue is ablated with the laser beam to remove the glue residue from the photomask.

In another embodiment, an adhesive removal method is provided. The method includes removing a pellicle from a photomask. The photomask is positioned with a glue residue in a path of a laser beam. The method may also include projecting the laser beam through a lens positioned between a laser source and the photomask. The laser beam is focused with the lens at a focal point on a surface of the glue residue. The method may also include sublimating the glue residue with the laser beam focused thereon In yet another embodiment, an apparatus for removing glue residue from a photomask is provided. The apparatus includes a pulsed laser source configured to generate electromagnetic energy at a wavelength in a range of between about 100 nm and about 400 nm. A transparent window is disposed in a propagation path of the electromagnetic energy. A sidewall enclosing a volume therein is disposed parallel to the propagation path of the electromagnetic energy and adjacent to the transparent window opposite the pulsed laser source. A lens is disposed within and normal to the propagation path of the electromagnetic energy and between the pulsed laser source and the transparent window. The lens is positioned to focus the electromagnetic energy at a focal point positioned along a central axis of the volume and opposite the transparent window.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
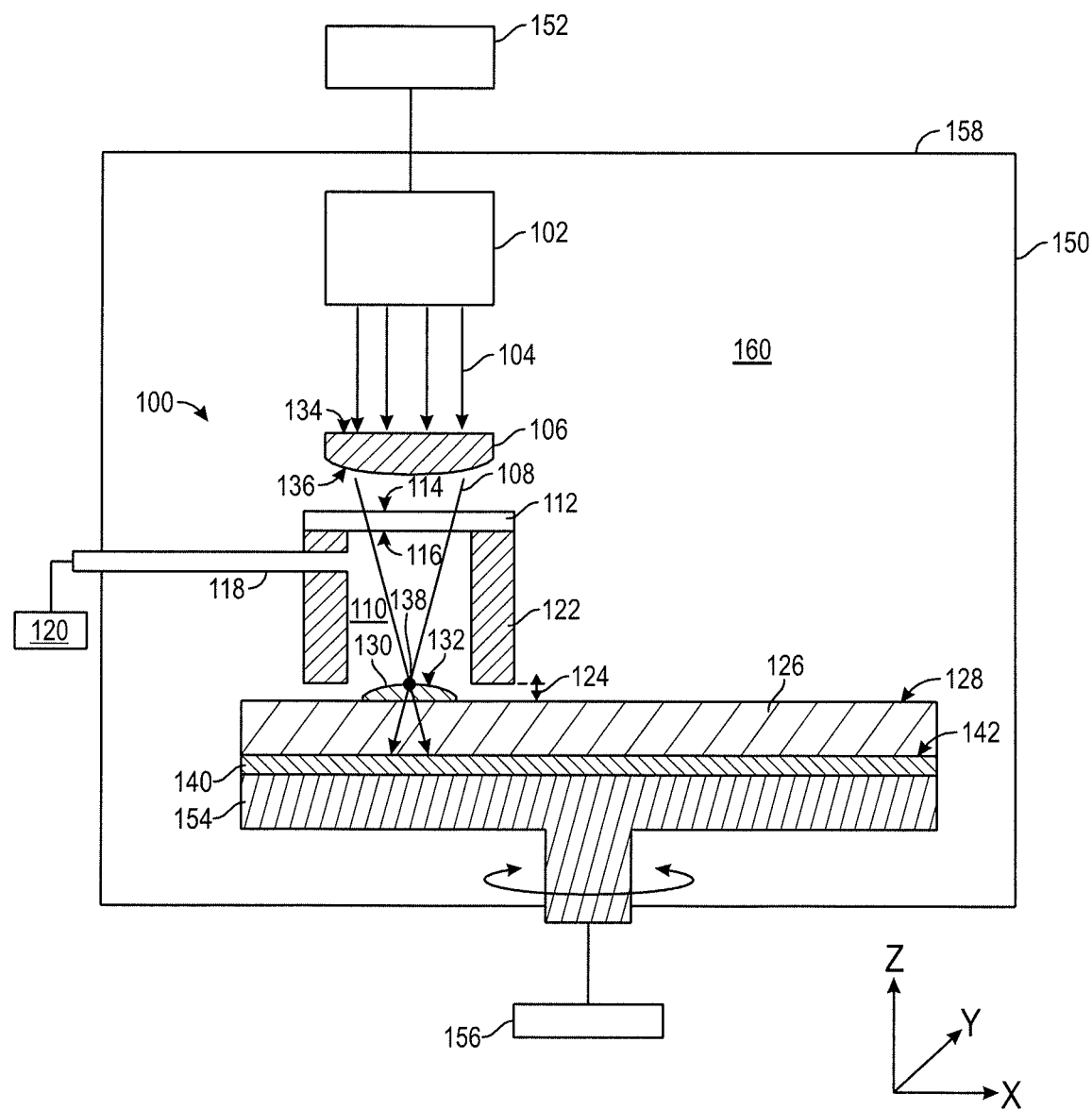
FIG. 1 is a schematic cross-sectional view of an ablation apparatus according to an embodiment of the disclosure.

One or more embodiments disclosed herein may generally relate to apparatus and methods for removing a glue residue from a photomask used for extreme ultraviolet (EUV) lithography. However, it is contemplated that the embodiments described herein may be utilized for other photolithography processes which utilize a photomask and a pellicle.

A pellicle is adhered to a photomask to prevent particle deposition on and contamination of the photomask. After a period of time, a buildup of particles on the pellicle may interfere with the pattern of the photomask being transferred to a photoresist. In that case, the pellicle is replaced. When a pellicle is removed from the photomask, a glue residue from a glue used to adhere the pellicle to the photomask may remain on the photomask. To ensure a new pellicle sufficiently adheres to the photomask, the glue residue is removed. The pellicle may also be removed from the photomask for periodic maintenance or cleaning of the photomask.

For a typical lithography process, the pellicle is adhered to the photomask using acrylic glue. A solvent may be used to quickly remove an acrylic glue residue from the photomask. However, for an extreme ultraviolet lithography process, an epoxy glue is generally used to adhere the pellicle to the photomask. Residue from the epoxy glue can be removed from a photomask using a solvent, but the process is time consuming and exposing the photomask to the solvent for a period of time can damage the photomask. For example, an acid-based solution used to remove the glue residue may etch and damage the photomask.

Accordingly, improved techniques for removing the glue residue are described herein. Embodiments described herein provide techniques for removing a glue residue from a photomask using laser energy. A laser source is used to remove the glue residue from the photomask without increasing a temperature of the glue residue. An increase in temperature may soften the glue residue which makes the glue more difficult to remove from the photomask.

To prevent an increase in temperature of the glue residue, an ultraviolet (UV) wavelength laser is used. The UV wavelength laser breaks chemical bonds of the glue residue without increasing a temperature thereof. Using a UV wavelength laser, the glue residue can be removed from the photomask in a short period of time (e.g., less than about 1 minute).

UV radiation from the laser may damage the photomask underlying the glue residue. A laser with a power of about 3 watts may damage the photomask. To prevent damage to the photomask, a low power laser of less than about 1 watt is used in one embodiment.

As used herein, photomask may refer to either a unitary apparatus formed from transparent material or a thin film deposited on a transparent photomask substrate. In some embodiments, the photomask substrate includes a mixture of fused silica and titanium dioxide. In one embodiment, a coating is disposed on a surface of the photomask substrate opposite the glue residue. In this embodiment, the coating includes a chromium nitride material. When removing the glue residue, the laser propagates through the photomask and the photomask substrate and damages the coating. To prevent damage to the coating, the low power laser may be used in combination with a high numerical aperture optic to focus the laser on a surface of the glue residue. The optic also defocuses the laser as it propagates through the photomask to reduce the energy density of the laser incident on a surface of the coating.

FIG. 1 is a schematic cross-sectional view of an ablation apparatus 100 that may be used to practice various embodiments of this disclosure. A chamber body 150 and lid assembly 158 define a first volume 160. In one embodiment, the chamber body 150 and the lid assembly 158 are fabricated from a metallic material, for example, aluminum, stainless steel, and alloys thereof. In another embodiment, the chamber body 150 and the lid assembly 158 are fabricated from ultraviolet-proof plastic materials. An ablation apparatus 100 is disposed within the first volume 160. A pedestal 154 is also disposed within the first volume 160. In one embodiment, the pedestal 154 is disposed in the first volume 160 opposite the ablation apparatus 100. The pedestal 154 is configured to support a photomask 126 during processing.

The ablation apparatus 100 includes a second volume 110 at least partially defined by a transparent window 112 and a sidewall 122. The transparent window 112 is coupled to the sidewall 122 and the sidewall 122 extends from the transparent window 112. In one embodiment, the sidewall 122 is fabricated from an opaque material. In another embodiment, the sidewall 122 is fabricated from a transparent material. Suitable materials for fabrication of the sidewall 122 include metallic materials, such as aluminum, stainless steel, or alloys thereof. The sidewall 122 may also be fabricated from polymeric materials, such as plastic materials or the like.

A laser source 102 is disposed within the first volume 160. A power source 152 is coupled to the laser source 102 to control electromagnetic energy emitted therefrom. The electromagnetic energy emitted from the laser source 102 is in the form of a laser beam. The laser beam travels into the second volume 110 along a propagation path 104. In one embodiment, the laser beam is coherent and collimated. In another embodiment, the laser beam is spatially and/or temporally decorrelated to attenuate an energy density of the laser beam. In one embodiment, the laser source 102 is a pulsed source and emits sequential laser pulses. A frequency of the laser pulses is between about 30 and about 120 per millisecond, or between about 30 kHz and about 120 kHz. In one embodiment, a duration of the pulsed laser is about 1 millisecond. In other embodiments, the duration of the pulsed laser is, for example, about 1 nanosecond, about 1 picosecond, or about 1 femtosecond. Thus, the laser source 102 may be considered a millisecond pulsed laser, a nanosecond pulsed laser, a picosecond pulsed laser, or a femtosecond pulsed laser. A wavelength of the electromagnetic energy emitted from the laser source 102 is within a range of between about 10 nm and about 400 nm, such as between about 200 nm and about 375 nm, for example about 355 nm.

The laser source 102 can be a low power source. In one embodiment, the laser source 102 has a power less than about 1 watt. The laser beam emitted from the laser source 102 propagates along the propagation path 104 and is incident on a surface 134 of a lens 106. In one embodiment, the surface 134 of the lens 106 is substantially flat. In another embodiment, the surface 134 of the lens 106 is concave or convex. The laser beam propagates through the lens 106 and exits a surface 136. In one embodiment, the surface 136 is concave. In another embodiment, the surface 136 is convex. While the lens 106 is illustrated as a single lens, the lens 106 may include one or more lenses in series (e.g., a compound lens). In one embodiment, the lens 106 is fabricated from a fused silica material. In another embodiment, the lens 106 is fabricated from a quartz material.

The lens 106 can have a high numerical aperture with a short focal length. The focal length may be between about 30 mm and about 110 mm, such as between about 50 mm and 100 mm, for example, about 56 mm. The focal length of the lens 106 may be measured between the surface 136 of the lens 106 and a focal point 138. The laser beam emitted from the laser source 102 is focused by the lens 106 to form a focused beam 108. The focal point 138 of the focused beam 108 is positioned at a surface 132 of a glue residue 130 to be removed from a photomask 126.

The photomask 126 may be disposed on and supported by the pedestal 154. The pedestal 154 is configured to rotate about a central axis during cleaning of the photomask 126. Alternatively or in addition, the pedestal 154 may be configured to move in the X and Y directions to position the glue residue 130 in the path of the focused beam 108. In one embodiment, the pedestal 154 is configured to move in the Z direction to increase or decrease a space 124 between the sidewall 122 and the photomask 126. Moving the pedestal 154 in the Z direction also enables changing of the focal point 138 of the focused beam 108 relative to the surface 132 of the glue residue 130. Accordingly, if the glue residue 130 has a non-uniform thickness, the pedestal 154 may be moved in the Z direction to more finely align the focal point 138 on the surface 132 to improve ablation of the glue residue 130.

A power source 156 is coupled to the pedestal 154 to control movement of the pedestal 154 relative to the ablation apparatus 100. The power source 156 may be a mechanical actuator, an electrical actuator, or a pneumatic actuator or the like which is configured to either rotate the pedestal 154 about the central axis and/or move the pedestal 154 in any of the X, Y, and Z directions. In one embodiment, the power source 156 is a stepper motor. In one embodiment, the ablation apparatus 100 is stationary within the first volume 160 while the pedestal 154 is configured to move such that the surface 132 of the glue residue 130 is positioned at the focal point 138. Alternatively, the ablation apparatus 100 may be movably disposed with the first volume 160 while the pedestal 154 remains stationary.

In one embodiment, the glue residue 130 is an epoxy material. The lens 106 focuses the laser beam such that the energy of the laser beam is focused at the focal point 138 and de-focused after the laser beam propagates through the glue residue 130. As such, an energy density of the laser beam is concentrated at the focal point 138 and the energy density of the laser beam is reduced as the laser beam propagates through the glue residue 130 and the photomask 126.

In one embodiment, the energy density of the focused beam 108 at the focal point 138 is greater than the energy density of the focused beam 108 at a coating 140 disposed on a surface 142 of the photomask 126 opposite the glue residue 130. That is, the laser beam is focused at the focal point 138 and is defocused at the surface 142 where the coating 140 is adhered to the photomask 126. The laser beam is defocused at the surface 142 to substantially reduce or prevent modification of the coating 140 at a location where the laser beam is incident on the surface 142 and the coating 140.

Upon exiting the surface 136 of the lens 106, the focused beam 108 travels to a first surface 114 of the transparent window 112. In one embodiment, the transparent window 112 is fabricated from a fused silica material. In another embodiment, the transparent window 112 is fabricated from a quartz material. In one embodiment, the transparent window 112 has a thickness of between about 1 mm and about 5 mm, such as about 3 mm.

The transparent window 112 does not substantially alter the propagation path of the focused beam 108 propagating therethrough. Thus, the focused beam 108 propagates through the transparent window 112 from the first surface 114 to a second surface 116 of the transparent window 112 without substantial modification or aberration being introduced into the focused beam 108.

The second volume 110 is configured to confine particles of the glue residue 130 that are removed from the photomask 126 during laser ablation of the glue residue 130. For example, ablation of the glue residue 130 may cause particles of the glue residue 130 to break apart from the photomask 126 and travel into the second volume 110. Evacuating the particles of the glue residue 130 from the second volume 110 may prevent re-deposition of the particles onto the surface 128 of the photomask 126.

In one embodiment, an exhaust port 118 is formed through the sidewall 122. The exhaust port 118 extends through the chamber body 150. The exhaust port 118 is fluidly connected to an exhaust pump 120 and enables fluid communication between the second volume 110 and the exhaust pump 120. The exhaust pump 120 generates a fluid flow path from the second volume 110 to the exhaust pump 120 by reducing a pressure in the second volume 110 to evacuate particles from the second volume 110. That is, a pressure in the volume 110 may be slightly less than an atmospheric pressure external to the second volume 110.

The sidewall 122 is spaced apart from the photomask 126 having the glue residue 130 thereon. A space 124 between the sidewall 122 and the photomask 126 enables a fluid to flow between the sidewall 122 and the photomask 126 and into the exhaust port 118. The fluid flow from the space 124 to the exhaust port 118 facilitates glue particle removal from the second volume 110 and prevents re-deposition of particles on the photomask 126. Together, the sidewall 122, exhaust port 118, and transparent window 112 form a fume extraction hood that evacuates particles from the second volume 110.

Figure 2:
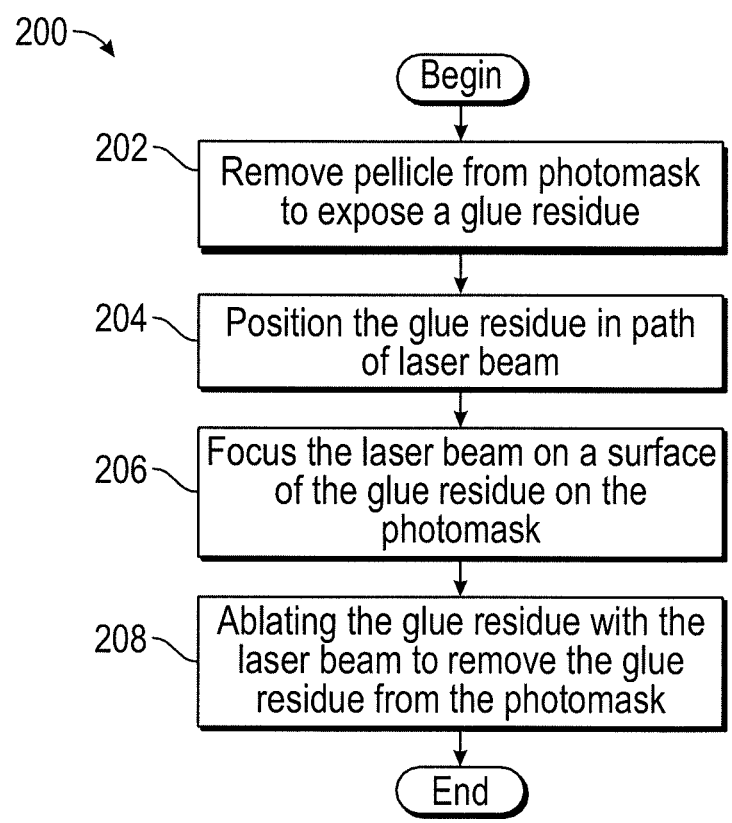
FIG. 2 illustrates operations of a method for removing a glue residue from a photomask according to an embodiment of the disclosure.

FIG. 2 illustrates operations of a method 200 for removing a glue residue from a photomask, according to one embodiment. As shown, the method 200 begins at operation 202 where a pellicle is removed from a photomask 126. Removal of the pellicle from the photomask 126 exposes a glue residue 130 on a surface 128 of the photomask 126.

At operation 204, the glue residue 130 is positioned in a propagation path 104 of a laser beam. A laser source 102 emits the laser beam which propagates through a focusing lens 106 disposed between the laser source 102 and the photomask 126.

At operation 206, the laser beam is focused by the lens 106 to a focal point 138 on a surface 132 of the glue residue 130 on the photomask 126. Focusing the laser at the focal point 138 provides an energy density of the laser at the focal point 138 greater than an energy density of the laser at a surface 142 of the photomask 126 opposite the glue residue 130.

At operation 208, the glue residue 130 is ablated by the laser beam to remove the glue residue 130 from the photomask 126. The glue residue 130 is ablated without increasing a temperature of the photomask 126. As discussed above, a temperature of the glue residue 130 remains substantially constant to prevent softening of the glue residue 130. Thus, when the glue residue 130 is ablated, particles of the glue residue 130 are removed from the photomask 126.

While the foregoing is directed to embodiments of the present disclosure, other and further embodiments of the disclosed subject matter may be devised without departing from the basic scope thereof, and the scope thereof is determined by the claims that follow.

The invention claimed is:

1. An apparatus for cleaning glue residue from a photomask, the apparatus comprising:
 a chamber body defining a first volume therein;
 a pedestal disposed within the first volume and capable of supporting the photomask; and
 an ablation apparatus within the first volume, the ablation apparatus comprising:
  a sidewall surrounding a second volume;
  a laser source configured to emit a laser beam through the second volume for ablating a glue residue from the photomask, wherein the laser source comprises:
   a pulsed laser source configured to generate electromagnetic energy of the laser beam at a wavelength in a range of between about 100 nm and about 400 nm:
  a transparent window disposed in a propagation path of the electromagnetic energy; and
  a lens disposed within and normal to the propagation path of the electromagnetic energy and between the pulsed laser source and the transparent window, the lens positioned to focus the electromagnetic energy at a focal point, the focal point positioned along a central axis of the second volume and opposite the transparent window.

2. The apparatus of claim 1, wherein a power of the pulsed laser source is less than about 1 watt.

3. The apparatus of claim 1, wherein a frequency of the pulsed laser source is between about 30 kHz and about 120 kHz.

4. The apparatus of claim 1, further comprising:
an exhaust port formed through the sidewall of the ablation apparatus.

5. The apparatus of claim 1, wherein the lens comprises a compound lens.

6. An apparatus for cleaning glue residue from a photomask, the apparatus comprising:
a chamber body defining a first volume therein;
a pedestal disposed within the first volume and capable of supporting the photomask; and
an ablation apparatus within the first volume, the ablation apparatus comprising:
a sidewall surrounding a second volume;
a laser source configured to emit a laser beam through the second volume for ablating a glue residue from the photomask;
a transparent window disposed in a propagation path of the laser beam; and
a lens disposed within and normal to the propagation path of the laser beam and between the laser source and the transparent window.

7. The apparatus of claim 6, wherein the lens is positioned to focus the laser beam at a focal point positioned along a central axis of the second volume and opposite the transparent window.

8. The apparatus of claim 6, wherein the sidewall extends from the transparent window opposite the lens.

9. The apparatus of claim 8, wherein the second volume is at least partially defined by the transparent window and the sidewall.

10. The apparatus of claim 9, wherein the laser source is a pulsed laser source.

11. The apparatus of claim 10, wherein a frequency of the pulsed laser source is between about 30 kHz and about 120 kHz.

12. The apparatus of claim 10, wherein the lens comprises a compound lens.

13. The apparatus of claim 10, wherein a power of the pulsed laser source is less than about 1 watt.

14. An apparatus for cleaning glue residue from a photomask, the apparatus comprising:
a chamber body defining a first volume therein;
a pedestal disposed within the first volume and capable of supporting the photomask; and
an ablation apparatus within the first volume, the ablation apparatus comprising:
a laser source;
a transparent window disposed in a propagation path of a laser beam emitted from the laser source;
a lens disposed between the laser source and the transparent window, the lens positioned within and normal to the propagation path of the laser beam; and
a sidewall surrounding a second volume between the lens and the pedestal, the sidewall extending from the transparent window opposite the laser source.

15. The apparatus of claim 14, wherein the lens is positioned to focus the laser beam at a focal point positioned along a central axis of the second volume and opposite the transparent window.

16. The apparatus of claim 14, wherein the laser source is a pulsed laser source having a frequency of between about 30 kHz and about 120 kHz.

17. The apparatus of claim 14, wherein the lens comprises a compound lens.

18. The apparatus of claim 14, further comprising:
an exhaust port formed through the sidewall of the ablation apparatus.

19. The apparatus of claim 14, wherein a power of the laser source is less than about 1 watt.

20. The apparatus of claim 1, further comprising a lid assembly that further defines the first volume.

* * * * *